United States Patent
Naono et al.

(10) Patent No.: US 8,641,173 B2
(45) Date of Patent: Feb. 4, 2014

(54) PIEZOELECTRIC FILM, METHOD FOR FORMING PIEZOELECTRIC FILM, PIEZOELECTRIC DEVICE AND LIQUID DISCHARGE DEVICE

(75) Inventors: Takayuki Naono, Kanagawa-ken (JP); Yoshiki Morita, Kanagawa-ken (JP); Yoshikazu Hishinuma, Kanagawa-ken (JP); Takamichi Fujii, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 540 days.

(21) Appl. No.: 12/656,737

(22) Filed: Feb. 16, 2010

(65) Prior Publication Data

US 2010/0214369 A1 Aug. 26, 2010

(30) Foreign Application Priority Data

Feb. 17, 2009 (JP) ................................. 2009-033398
Dec. 18, 2009 (JP) ................................. 2009-287227

(51) Int. Cl.
*B41J 2/045* (2006.01)
*H01L 41/22* (2013.01)

(52) U.S. Cl.
USPC ............................................ 347/68; 29/25.35

(58) Field of Classification Search
USPC ..................................... 347/68; 310/328, 358
See application file for complete search history.

(56) References Cited

U.S. PATENT DOCUMENTS

| | | | |
|---|---|---|---|
| 6,013,970 A | 1/2000 | Nishiwaki et al. | |
| 6,284,434 B1 | 9/2001 | Kamei et al. | |
| 7,312,558 B2 | 12/2007 | Fujii et al. | |
| 8,172,372 B2 * | 5/2012 | Fujii et al. | 347/68 |
| 2006/0244788 A1 | 11/2006 | Li | |
| 2008/0231667 A1 | 9/2008 | Arakawa et al. | |
| 2009/0072673 A1 * | 3/2009 | Fujii et al. | 310/358 |
| 2010/0079552 A1 * | 4/2010 | Arakawa et al. | 347/68 |

FOREIGN PATENT DOCUMENTS

| | | |
|---|---|---|
| JP | 6-181344 A | 6/1994 |
| JP | 8-125245 A | 5/1996 |
| JP | 9-298324 A | 11/1997 |
| JP | 11-192713 A | 7/1999 |
| JP | 2000-52559 A | 2/2000 |
| JP | 2002-370354 A | 12/2002 |
| JP | 2003-188433 A | 7/2003 |
| JP | 2006-303425 A | 11/2006 |
| JP | 2008-55871 A | 3/2008 |
| JP | 2008-266770 A | 11/2008 |

OTHER PUBLICATIONS

Wikipedia Article: Miller Index, see Figure 3.*
Merriam-Webster's Online Dictionary: Orientation, Definition 1b.*
Notice of Grounds for Rejection, dated Oct. 13, 2009, issued in corresponding application JP-2009-033398.
Japanese Office Action, dated Oct. 22, 2013, for Japanese Application No. 2009-287227 with a partial English translation.

* cited by examiner

*Primary Examiner* — Lisa M Solomon
(74) *Attorney, Agent, or Firm* — Birch, Stewart, Kolasch & Birch, LLP

(57) ABSTRACT

A piezoelectric film of the present invention has a surface roughness value P-V of not more than 170.0 nm, which is defined by a difference between a maximum height (peak value P) and a minimum height (valley value V) on a film surface, a piezoelectric constant $d_{31}$ greater than 150 pC/N and a breakdown voltage of 80 V or more, which is defined by an applied voltage that results in a current value of 1 μA or more.

20 Claims, 9 Drawing Sheets

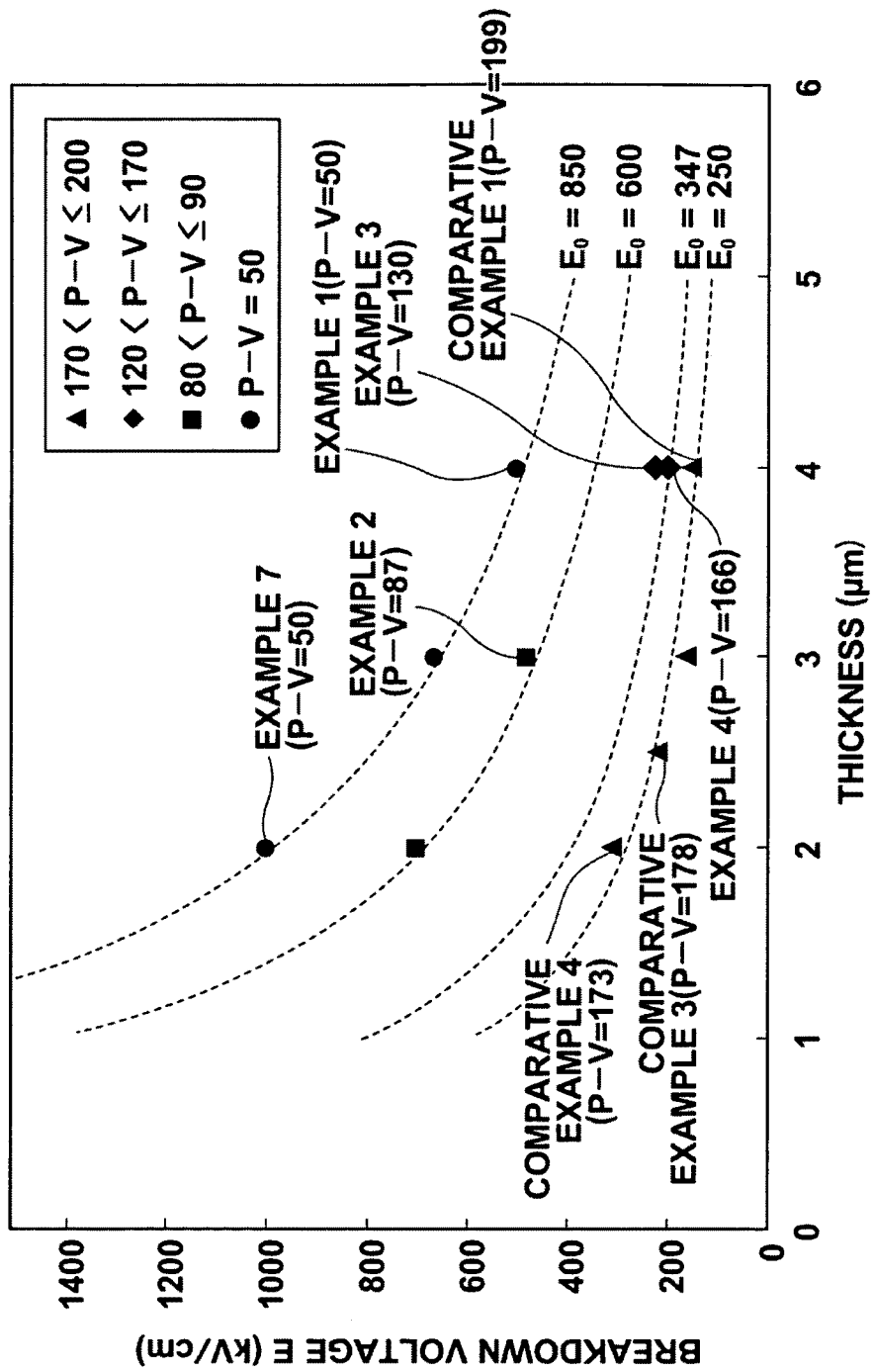

PIEZOELECTRIC FILM, METHOD FOR FORMING PIEZOELECTRIC FILM, PIEZOELECTRIC DEVICE AND LIQUID DISCHARGE DEVICE

BACKGROUND OF THE INVENTION

1. Field of the Invention

The present invention relates to a piezoelectric film and a method for forming the piezoelectric film, as well as a piezoelectric device and a liquid discharge device employing the piezoelectric film.

2. Description of the Related Art

Piezoelectric devices, which include a piezoelectric material that expands or contracts when the intensity of an applied electric field is increased or decreased and an electrode for applying the electric field to the piezoelectric material, are used in applications, such as piezoelectric actuators provided in inkjet recording heads. As piezoelectric materials, PZT (lead zirconium titanate) and substitution systems of PZT, which has a part of the A-site and/or B-site thereof being substituted with a different element, etc., are known.

In view of reduction of size and thickness of piezoelectric devices, a piezoelectric material in the form of a thin film may be preferred. The piezoelectric material in the form of a thin film has a lower withstand voltage than a piezoelectric material in the form of a thick bulk body. Therefore, when the thin-film piezoelectric material is repeatedly driven with application of a voltage thereto, it is likely to suffer breakdown and be deteriorated in displacement property.

Japanese Unexamined Patent Publication No. 2003-188433 (which is hereinafter referred to as patent document 1) discloses a piezoelectric device including a substrate, and a first orientation controlling layer, a lower electrode, a second orientation controlling layer, a piezoelectric film and an upper electrode formed in this order on the substrate (see claim 1). Patent document 1 teaches that properties, such as withstand voltage, are improved by controlling the orientation of the piezoelectric film with the two orientation controlling layers (see paragraph 0118).

In Examples 1 to 3 of patent document 1, PZT films (2.6 to 3.0 μm-thick) having a piezoelectric constant $d_{31}$ ranging from 120 to 128 pC/N and a withstand voltage ranging from 114 to 123 V are formed through sputtering (see paragraphs 0036 to 0078).

Japanese Unexamined Patent Publication No. 2002-370354 (which is hereinafter referred to as patent document 2) discloses a piezoelectric device which includes a lower electrode containing Pt formed on a Ti adhesion layer having a film thickness of not more than 80 angstrom (see claim 2). Patent document 2 teaches that formation of protrusions on the surface of the lower electrode is minimized with the film thickness of not more than 80 angstrom of the Ti adhesion layer, and the withstand voltage is improved (see paragraphs 0097-0098).

In Examples 1 and 5 of patent document 2, PZT films are formed through sputtering. It is shown in Example 1 that $d_{31}=150$ pC/N is achieved. The relationship between the film thickness of the Ti adhesion layer and the withstand voltage is reported and evaluated in Example 5, and a withstand voltage ranging from 50 to 80 V is achieved with a 1 μm-thick PZT film (see Table 4 and paragraph 0100).

Japanese Unexamined Patent Publication No. 2008-055871 (which is hereinafter referred to as patent document 3) discloses a piezoelectric device which includes an upper electrode formed in a depression provided through a RIE process, or the like, in an upper layer portion of a piezoelectric film in order to improve the withstand voltage (see claim 1). It is shown in Examples 1 and 2 that 4 μm-thick PZT films formed through sputtering had a withstand voltage ranging from 120 to 150 V.

In these examples, however, the size of the upper electrode was 75 micrometer-wide, which is far smaller than that in specifications for practical use. It therefore seems that higher values were estimated for the withstand voltage. Although no data of the piezoelectric constant is reported, the intrinsic PZT does not provide a high piezoelectric constant. The present inventors formed intrinsic PZT films through sputtering according to the method disclosed in patent document 3, and the PZT films had the piezoelectric constant $d_{31}$ around 130 pC/N.

Patent documents 1 to 3 report the PZT films formed through sputtering having a withstand voltage ranging from 50 to 150 V. However, all of the PZT films are intrinsic PZT films and have a piezoelectric constant $d_{31}$ of not more than 150 pC/N. With respect to piezoelectric films, a film having a smaller piezoelectric constant $d_{31}$ tends to exhibit a smaller flexural displacement measured under conditions of a fixed film thickness and a fixed applied voltage, and a higher withstand voltage. In patent documents 1 and 3, the high withstand voltage is achieved because the piezoelectric constant $d_{31}$ is not high.

The PZT film of patent document 1 requires providing the two orientation controlling layers as underlayers, and the PZT film of patent document 3 requires providing the depression in the upper layer portion of the piezoelectric film. Therefore, the process is not simple.

U.S. Pat. No. 7,312,558 (hereinafter referred to as patent document 4) discloses a PZT piezoelectric film having a columnar structure, which is formed by a number of columnar particles extending in the thickness direction and having a ratio of average cross-sectional diameter to length of not less than 1/50 and not more than 1/14, with an orientation controlling layer made of a cubic or tetragonal perovskite oxide provided as an underlayer (see claim 1). Patent document 4 discloses, in table 2, etc., piezoelectric films of substitution systems of PZT doped with Nb, or the like, having a piezoelectric constant $d_{31} \geq 200$ pc/N and a breakdown voltage of 100 V or more. However, the piezoelectric film of patent document 4 requires orientation control by the orientation controlling layer.

As another means to improve the withstand voltage, it has been proposed to provide a protective film. However, requiring a film, such as an orientation controlling layer or a protective film, which is not essential for a piezoelectric device, increases the number of process steps and complicates the process, resulting in increased production costs.

SUMMARY OF THE INVENTION

In view of the above-described circumstances, the present invention is directed to providing a piezoelectric film with good piezoelectric performance and withstand voltage and a method for forming the piezoelectric film without requiring a film, such as an orientation controlling layer or a protective film, which is not essential for a piezoelectric device.

A first aspect of the piezoelectric film of the invention is a piezoelectric film having a surface roughness value P-V of not more than 170.0 nm, which is defined by a difference between a maximum height (peak value P) and a minimum height (valley value V) on a film surface, a piezoelectric constant $d_{31}$ greater than 150 pC/N and a breakdown voltage of 80 V or more, which is defined by an applied voltage that results in a current value of 1 μA or more.

A second aspect of the piezoelectric film of the invention is a piezoelectric film having a 100% breakdown electric field value $E_0$ of over 250 kV/cm per unit space in a weakest link model represented by the equation below:

$$E = E_0 \{-\ln(1 - P_x)\}^{\frac{1}{m}} d^{-\frac{1}{m}}$$

(wherein E is a breakdown voltage that causes breakdown with a probability $P_x$, $P_x$=0.9, m is a shape parameter and d is a film thickness.)

A first aspect of the method for forming a piezoelectric film includes forming the film under conditions where a surface roughness value P-V is not more than 170.0 nm, which is defined by a difference between a maximum height (peak value P) and a minimum height (valley value V) on a film surface.

A second aspect of the method for forming the piezoelectric film of the invention includes forming the film under conditions where a 100% breakdown electric field value $E_0$ per unit space is over 250 kV/cm in a weakest link model represented by the equation below:

$$E = E_0 \{-\ln(1 - P_x)\}^{\frac{1}{m}} d^{-\frac{1}{m}}$$

(wherein E is a breakdown voltage that causes breakdown with a probability $P_x$, $P_x$=0.9, m is a shape parameter and d is a film thickness.)

The values of m and $E_0$ in the weakest link model can be found as follows (see FIG. 8). Two or more piezoelectric films having different film thicknesses formed under the same conditions except the film thickness are prepared. A withstand voltage (a breakdown voltage defined by an applied voltage that results in a current value of 1 µA or more) is measured for each film, and a relationship between the film thickness and the withstand voltage is plotted. The values of m and $E_0$ in the above equation of the weakest link model are varied to find the values of m and $E_0$ that bring the plot onto a fitting curve.

The piezoelectric device of the invention includes: the piezoelectric film of the first aspect of the invention; and an electrode for applying an electric field to the piezoelectric material.

The liquid discharge device of the invention includes: the piezoelectric device of the invention; and a liquid discharge member disposed adjacent to the piezoelectric device, the liquid discharge member comprising a liquid reservoir for storing a liquid, and a liquid discharge port for discharging the liquid from the liquid reservoir to the outside in response to application of the electric field to the piezoelectric film.

According to the invention, a piezoelectric film with good piezoelectric performance and withstand voltage, and a method for forming the piezoelectric film are provided without requiring a film, such as an orientation controlling layer or a protective film, which is not essential for a piezoelectric device, and thus without requiring a complicated process.

Since the piezoelectric film of the invention has a high withstand voltage, a higher maximum applied voltage can be set. With the higher maximum applied voltage, the amount of displacement of the piezoelectric film can be increased, and this may be preferable for such applications as liquid discharge devices.

BRIEF DESCRIPTION OF THE DRAWINGS

FIG. 8 shows relationships between a film thickness and a withstand electric field for the piezoelectric films obtained in Examples 1 to 8 and Comparative Examples 1 to 4, and fitting with a weakest link model.

DESCRIPTION OF THE PREFERRED EMBODIMENTS

Figure 1:
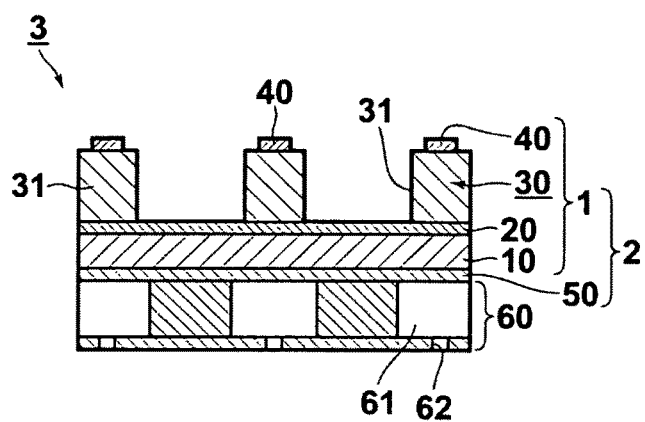
FIG. 1 is a sectional view illustrating the structure of a piezoelectric device and an inkjet recording head (liquid discharge device) according to one embodiment of the present invention.

The present inventors have succeeded in improving the withstand voltage of a piezoelectric film of a composition having a high piezoelectric performance, i.e., the piezoelectric constant $d_{31}$ greater than 150 pC/N, by optimizing film formation conditions. Further, the present inventors have examined film properties of piezoelectric films with good withstand voltage, and have found out characteristics of the piezoelectric films with good withstand voltage. The present inventors have found that a piezoelectric film with good withstand voltage can stably be provided by forming a film having such characteristics.

Specifically, the present inventors have found that a piezoelectric film with good withstand voltage has a dense entire structure with a low amount of small pores in the vicinity of the film surface and a small surface roughness after completion of film formation. Further, the present inventors have found through evaluation using a weakest link model that a piezoelectric film with good withstand voltage has a 100% breakdown electric field value $E_0$ of not less than a certain value per unit space.

A first aspect of the piezoelectric film of the invention is a piezoelectric film having a surface roughness value P-V of not more than 170.0 nm, which is defined by a difference between a maximum height (peak value P) and a minimum height (valley value V) on a film surface, a piezoelectric constant $d_{31}$ greater than 150 pC/N and a breakdown voltage of 80 V or more, which is defined by an applied voltage that results in a current value of 1 µA or more.

According to the invention, a piezoelectric film having a piezoelectric constant $d_{31}$ of 160 pC/N or more and a breakdown voltage of 80 V or more can be provided.

The present inventors have accomplished a piezoelectric film having a piezoelectric constant $d_{31}$ of 200 pC/N or more and a breakdown voltage of 80 V or more.

The present inventors accomplished a piezoelectric film having a piezoelectric constant $d_{31}$ of 200 pC/N or more and a breakdown voltage ranging from 80 to 200 V or more (see Examples 1 to 8, which will be described later, and Table 2).

It should be noted that the piezoelectric constant herein is $d_{31}$, which indicates expansion and contraction along the surface of the electrode, and all the values of piezoelectric constant presented herein are absolute values.

A second aspect of the piezoelectric film of the invention is a piezoelectric film having a 100% breakdown electric field value $E_0$ of over 250 kV/cm per unit space in a weakest link model represented by the equation below:

$$E = E_0 \{-\ln(1-P_x)\}^{\frac{1}{m}} d^{-\frac{1}{m}}$$

(wherein E is a breakdown voltage that causes breakdown with a probability $P_x$, $P_x$=0.9, m is a shape parameter and d is a film thickness.)

The present inventors have accomplished a piezoelectric film having a 100% breakdown electric field value $E_0$ of 347 kV/cm or more per unit space (see Examples 1 to 8, which will be described later, FIG. 8, and Table 2).

The upper limit of the 100% breakdown electric field value $E_0$ per unit space is not particularly limited. With respect to the piezoelectric films actually formed by the present inventors, the upper limit of the 100% breakdown electric field value $E_0$ per unit space was 850 kV/cm.

The present inventors have accomplished a piezoelectric film having a piezoelectric constant $d_{31}$ greater than 150 pC/N and a 100% breakdown electric field value $E_0$ of over 250 kV/cm per unit space.

The present inventors have accomplished a piezoelectric film having a piezoelectric constant $d_{31}$ of 200 pC/N or more and a 100% breakdown electric field value $E_0$ of over 250 kV/cm per unit space (see Examples 1 to 8, which will be described later, and Table 2).

The present inventors have found that a piezoelectric film having a breakdown voltage of 80 V or more is a film having a low surface roughness at the time of completion of film formation, where a surface roughness value P-V, which is defined by a difference between a maximum height (peak value P) and a minimum height (valley value V) on the film surface, is not more than 170.0 nm.

Usually, no particular surface treatment is carried out after the film formation. Therefore, the surface roughness at the time of completion of film formation is maintained after the completion of film formation.

That is, in the piezoelectric film of the invention, the surface roughness value P-V defined by a difference between a maximum height (peak value P) and a minimum height (valley value V) on the film surface is not more than 170.0 nm.

The piezoelectric film of the invention may satisfy the above surface roughness value P-V under the condition where the piezoelectric film is not subjected to a surface treatment to reduce the surface roughness after the film is formed.

The piezoelectric film of the invention may be a film formed under conditions where the surface roughness value P-V, which is defined by a difference between a maximum height (peak value P) and a minimum height (valley value V) on the film surface, is not more than 170.0 nm at the time of completion of film formation.

The "surface roughness value P-V" herein is measured as follows.

A surface morphology of the piezoelectric film is measured with an AFM to find a maximum height (peak value P) and a minimum height (valley value V) in an area of two micrometers square, and a difference between these values is calculated as the value P-V.

A process used to form the piezoelectric film of the invention is not particularly limited, and may be a gas phase process or a liquid phase process.

A vapor deposition process using plasma may be employed to form the piezoelectric film of the invention.

The present inventors have found that a film having the above-described properties can stably be formed through a vapor deposition process using plasma which is carried out under the conditions where a pressure during film formation is not more than 1.1 Pa and a substrate-target distance is 80 mm or more.

The present inventors have found that a film having the above-described properties can stably be formed through a vapor deposition process using plasma which is carried out under the conditions where the pressure during film formation is not more than 1.0 Pa and the substrate-target distance is 60 mm or more, or optionally the pressure during film formation is not more than 0.7 Pa and the substrate-target distance is 60 mm or more.

Examples of the vapor deposition process using plasma may include sputtering and PLD. In a conventional vapor deposition process using plasma, electric discharge is unstable under a pressure during film formation of not more than 1.1 Pa, and therefore such a pressure is usually avoided and not positively set as the pressure during film formation. The present inventors have found that this low level pressure during film formation is effective, which is usually not employed in conventional plasma vapor deposition processes. Further, the present inventors have found that it is effective to control the pressure during film formation and the substrate-target distance.

It is believed that, under conditions where plasma ions strongly impinge on the substrate, damage produced by the plasma is large, and this tends to result in a film having an entire film structure which is not dense and has a high surface roughness. It is believed that, by reducing the pressure during film formation and increasing the substrate-target distance, the energy of the plasma ions impinging on the substrate can be reduced, and a dense film with a low surface roughness can be formed.

As the substrate-target distance is increased, the plasma damage is decreased. Therefore, under the condition where the substrate-target distance is 80 mm or more, a higher upper limit is allowed for the pressure during film formation than that under the condition where the substrate-target distance is 60 mm or more.

It should be noted that the surface roughness value P-V is an indication of the degree of density of the film, and not only the surface properties contribute to the withstand voltage. Therefore, a film with a withstand voltage as high as the level of the withstand voltage specified in the invention cannot be provided even if a surface treatment to reduce the surface roughness value P-V is carried out on a film which has a high surface roughness value P-V when it is formed. In contrast, if a surface treatment to increase the surface roughness value P-V is carried out on the film of the invention, which has a low surface roughness value P-V when it is formed, the film structure with the high withstand voltage is maintained.

Although it is not clearly supported, the present inventors believe that the dense film structure provides an effect where the density decreases at a site of the film at which the breakdown starts and an effect where arcing is suppressed by decrease of the amount of small pores in the vicinity of the film surface, and these effects synergistically result in the improved withstand voltage.

Patent document 4 mentioned above at the "Description of the Related Art" section discloses a PZT piezoelectric film having a columnar structure, which is formed by a number of columnar particles extending in the thickness direction and having a ratio of average cross-sectional diameter to length of not less than 1/50 and not more than 1/14, with an orientation controlling layer made of a cubic or tetragonal perovskite oxide provided as an underlayer (see claim 1). Patent document 4 discloses, in table 2, etc., piezoelectric films of substitution systems of PZT doped with Nb, or the like, having a piezoelectric constant $d_{31} \geq 200$ pc/N and a breakdown voltage of 100 V or more. Patent document 4 does not disclose the surface roughness values P-V defined in the present invention. Further, the piezoelectric film of patent document 4 requires an orientation controlling layer as an underlayer. In contrast, the piezoelectric film of the invention does not require such an orientation controlling layer as an underlayer.

That is, the invention can provide a piezoelectric film having the above-described characteristics under conditions where the orientation controlling layer is not provided as an underlayer.

The cross-sectional structure of the piezoelectric film of the invention is not particularly limited. The piezoelectric film of the invention may have a columnar structure including numerous columnar bodies extending along a direction which is not parallel to the film surface.

With respect to specification of the surface roughness of piezoelectric films, the following prior art techniques are found.

Japanese Unexamined Patent Publication No. 9 (1997)-298324 discloses a piezoelectric film having a thickness within the range from 1 to 10 μm, a crystal grain size within the range from 0.05 to 1 μm, and a surface roughness $R_{max}$ of not more than 1 μm (see claim 1). This document further discloses a method for producing the piezoelectric film, in which a seed crystal is grown through a process, such as the sol-gel method or sputtering, and subsequently the crystal is grown through hydrothermal synthesis (see claims 10,13, etc.) This document teaches that the piezoelectric film can sufficiently be covered with an upper electrode by controlling the surface roughness $R_{max}$ to be not more than 1 μm.

Japanese Unexamined Patent Publication No. 2000-052559 discloses a piezoelectric film having a surface roughness $R_{max}$ of not more than 20 nm (see claim 2). The film having such a surface roughness property is accomplished by elaborately controlling conditions for hydrothermal synthesis (see claim 6, etc.)

As stated in paragraph 0005 of the former document and paragraph 0005 of the latter document, both the documents are directed to solving a problem that conventional hydrothermal synthesis processes provide piezoelectric films having a high surface roughness. Although theses documents include description of $R_{max}$, which is generally used as an indication of surface roughness, they do not mention the surface roughness value P-V. These documents do not mention the withstand voltage. The hydrothermal synthesis processes used to form the films described in these documents do not provide a film having a columnar structure. Further, the described processes require several steps, such as a step of applying a precursor and a step of heating for crystallization, and thus are complicated. Therefore, it is difficult to form films having desired properties in a repeatable manner.

Japanese Unexamined Patent Publication No. 6 (1994)-181344 discloses a piezoelectric device, wherein at least one of a piezoelectric material or a surface electrode has a surface roughness value $R_{max}$ of not more than 1 μm, and at least one of the piezoelectric material or a driving member has a difference of not more than 2 μm between the maximum thickness and the minimum thickness (see claim 1). The surface roughness values disclosed in this document are achieved through polishing (see paragraph 0013).

Japanese Unexamined Patent Publication No. 8 (1996)-125245 discloses a piezoelectric device, wherein a piezoelectric plate has a surface roughness value $R_{max}$ of not less than 0.1 μm and not more than 2.3 μm (see claim 1). The surface roughness value disclosed in this document is achieved through polishing and etching (see paragraph 0016).

Although these documents disclose the values of surface roughness $R_{max}$, which is generally used as an indication of surface roughness, they do not disclose the surface roughness P-V defined in the present invention. Further, the surface roughness values disclosed in these documents are achieved by reducing the surface roughness through polishing, etc. In contrast, the surface roughness value P-V defined in the present invention is a surface roughness value of a formed film which is not basically subjected to a surface treatment, such as polishing.

The film thickness of the piezoelectric film of the invention is not particularly limited. The film thickness may be in the range from 500 nm to 10 μm, for example. If the film thickness is 1.0 μm or more, fitting in a weakest link model can be applied. The present inventors demonstrate herein that the fitting in a weakest link model can successfully be applied at least within the range of film thickness from 2.0 to 4.0 μm (see FIG. 8).

The composition of the piezoelectric film of the invention is not particularly limited; however, the piezoelectric film of the invention may be formed by one or two or more perovskite oxides (P) (which may contain inevitable impurities) represented by the formula below:

ABO₃          General Formula (P)

(wherein A represents an A-site element and is at least one element including Pb; B represents a B-site element and is at least one element selected from the group consisting of Ti, Zr, V, Nb, Ta, Cr, Mo, W, Mn, Sc, Co, Cu, In, Sn, Ga, Zn, Cd, Fe and Ni; O is an oxygen element; and a molar ratio of A-site element (A):B-site element:oxygen element is 1:1:3 as a standard; however, the molar ratio may be varied from the standard molar ratio within a range where a perovskite structure is obtained.)

In view of providing a high piezoelectric constant, the piezoelectric film of the invention may be formed by one or two or more perovskite oxides (PX) (which may contain inevitable impurities) represented by the formula below:

A(Zr$_x$,Ti$_y$,M$_z$)O          (PX)

(wherein A represents an A-site element and is at least one element including Pb; M represents one or two or more metal elements; 0<x, 0<y, 0<z; and a molar ratio of A-site element (A):B-site element (Zr,Ti,M):oxygen element is 1:1:3 as a standard; however, the molar ratio may be varied from the standard molar ratio within a range where a perovskite structure is obtained.)

In the perovskite oxide (PX), M is not particularly limited; however, M may be a donor ion, and specifically at least one element selected from the group consisting of V, Nb, Ta and Sb.

An element other than Pb that may be contained at the A-site is not particularly limited; however, the element other than Pb may be a donor ion, and specifically at least one element selected from various lanthanoids, such as Bi and La.

A first aspect of the method for forming the piezoelectric film of the invention includes forming the film under conditions where a surface roughness value P-V is not more than 170.0 nm, which is defined by a difference between a maximum height (peak value P) and a minimum height (valley value V) on a film surface.

A second aspect of the method for forming the piezoelectric film of the invention includes forming the film under conditions where a 100% breakdown electric field value $E_0$ per unit space is over 250 kV/cm in a weakest link model represented by the equation below:

$$E = E_0 \{-\ln(1-P_x)\}^{\frac{1}{m}} d^{-\frac{1}{m}}$$

(wherein E is a breakdown voltage that causes breakdown with a probability $P_x$, $P_x$=0.9, m is a shape parameter and d is a film thickness.)

The present inventors have found that a piezoelectric film with good withstand voltage can stably be provided by forming the film under the above conditions.

In the method for forming the piezoelectric film of the invention, the film may be formed under conditions where the 100% breakdown electric field value $E_0$ per unit space is 347 kV/cm or more.

The upper limit of the 100% breakdown electric field value $E_0$ per unit space is not particularly limited. With respect to the piezoelectric films actually formed by the present inventors, the upper limit of the 100% breakdown electric field value $E_0$ per unit space was 850 kV/cm.

In the method for forming the piezoelectric film of the invention, the film may be formed under conditions where the surface roughness value P-V, which is defined by a difference between a maximum height (peak value P) and a minimum height (valley value V) on the film surface, is not more than 170.0 nm at the time of completion of film formation.

A process used to form the piezoelectric film of the invention is not particularly limited, and may be a gas phase process or a liquid phase process. In the method for forming the piezoelectric film of the invention, the film may be formed under conditions where the pressure during film formation, which is achieved through a vapor deposition process using plasma, is not more than 1.0 Pa and the substrate-target distance is not less than 80 mm.

In the method for forming the piezoelectric film of the invention, the film may be formed under conditions where the pressure during film formation through a vapor deposition process using plasma is not more than 1.0 Pa and the substrate-target distance is not less than 60 mm, or optionally the pressure during film formation is not more than 0.7 Pa and the substrate-target distance is not less than 60 mm.

The piezoelectric devices disclosed in patent documents 1 and 4 mentioned above at the "Description of the Related Art" section require providing the orientation controlling layer, and the piezoelectric device disclosed in patent document 3 requires providing the depression in the upper layer portion of the piezoelectric film. Therefore, the process is not simple in both the cases. The present inventors have succeeded in improving the withstand voltage without requiring a complicated process by optimizing the film formation conditions in the vapor deposition process.

As described above, according to the invention, a piezoelectric film with good piezoelectric performance and withstand voltage can be provided without requiring a film, such as an orientation controlling layer or a protective film, which is not essential for a piezoelectric device, and thus without requiring a complicated process.

Since the piezoelectric film of the invention has a high withstand voltage, a higher maximum applied voltage can be set. With the higher maximum applied voltage, the amount of displacement of the piezoelectric film can be increased, and this may be preferable for such applications as liquid discharge devices.

Piezoelectric Device and Inkjet Recording Head

The structures of a piezoelectric device and an inkjet recording head (liquid discharge device) including the piezoelectric device according to one embodiment of the invention are described with reference to FIG. 1. FIG. 1 is a sectional view illustrating the main portion of the inkjet recording head (a sectional view taken along the thickness direction of the piezoelectric device). For ease of visual understanding, the components shown in the drawing are not to scale.

A piezoelectric device 1 of this embodiment includes a substrate 10, and a lower electrode 20, a piezoelectric film 30 and upper electrodes 40 which are sequentially formed on the substrate 10. An electric field in the thickness direction is applied to the piezoelectric film 30 via the lower electrode 20 and the upper electrodes 40.

The lower electrode 20 is formed over substantially the entire surface of the substrate 10. The piezoelectric film 30, which is formed by line-shaped protrusions 31 arranged in stripes pattern is formed on the lower electrode 20, and the upper electrodes 40 are formed on the individual protrusions 31.

The pattern of the piezoelectric film 30 is not limited to one shown in the drawing, and may be designed as appropriate. Alternatively, the piezoelectric film 30 may be a continuous film. However, when the piezoelectric film 30 is not a continuous film and has the pattern including the plurality of separate protrusions 31, the individual protrusions 31 can smoothly expand or contract, thereby providing larger displacement.

The substrate 10 is not particularly limited, and may be any of various substrates, such as silicon, silicon oxide, stainless steel (SUS), yttrium stabilized zirconia (YSZ), alumina, sapphire, SiC, and $SrTiO_3$. The substrate 10 may be a multilayer substrate, such as a SOI substrate including a $SiO_2$ film and a Si active layer formed on a silicon substrate.

The composition of the lower electrode 20 is not particularly limited, and examples thereof may include a metal or a metal oxide, such as Au, Pt, Ir, $IrO_2$, $RuO_2$, $LaNiO_3$, and $SrRuO_3$, as well as combinations thereof. The composition of the upper electrodes 40 is not particularly limited, and examples thereof may include the example materials listed for the lower electrode 20, electrode materials commonly used in semiconductor processes, such as Al, Ta, Cr and Cu, and combinations thereof. The thicknesses of the lower electrode 20 and the upper electrodes 40 are not particularly limited; however, their thicknesses may be in the range from 50 to 500 nm.

A piezoelectric actuator 2 includes a vibrating plate 50, which vibrates along with expansion and contraction of the piezoelectric film 30, attached on the back side of the substrate 10 of the piezoelectric device 1. The piezoelectric actuator 2 also includes a controlling means (not shown), such as a driving circuit, for controlling drive of the piezoelectric device 1.

An inkjet recording head (liquid discharge device) 3 generally includes, at the back side of the piezoelectric actuator 2, an ink nozzle (liquid storing and discharging member) 60 including an ink chamber (liquid reservoir) 61 for storing ink and an ink discharge port (liquid discharge port) 62 through which the ink is discharged from the ink chamber 61 to the outside. There are a plurality of ink chambers 61 provided correspondingly to the number and pattern of the protrusions 31 of the piezoelectric film 30. In the inkjet recording head 3, the piezoelectric device 1 expands or contracts when the intensity of the electric field applied to the piezoelectric device 1 is increased or decreased, thereby controlling discharge of the ink from the ink chamber 61 and the amount of the discharged ink.

Instead of attaching the vibrating plate 50 and the ink nozzle 60 which are members separate from the substrate 10, parts of the substrate 10 may be machined to form the vibrating plate 50 and the ink nozzle 60. For example, if the substrate 10 is a multilayer substrate, such as a SOI substrate, the substrate 10 may be etched at the back side thereof to form the ink chamber 61, and then the substrate may be machined to form the vibrating plate 50 and the ink nozzle 60.

The structures of the piezoelectric device 1 and the inkjet recording head 3 of this embodiment are as described above. According to this embodiment, a piezoelectric device with good piezoelectric performance and withstand voltage can be provided.

Inkjet Recording Device

Figure 2:
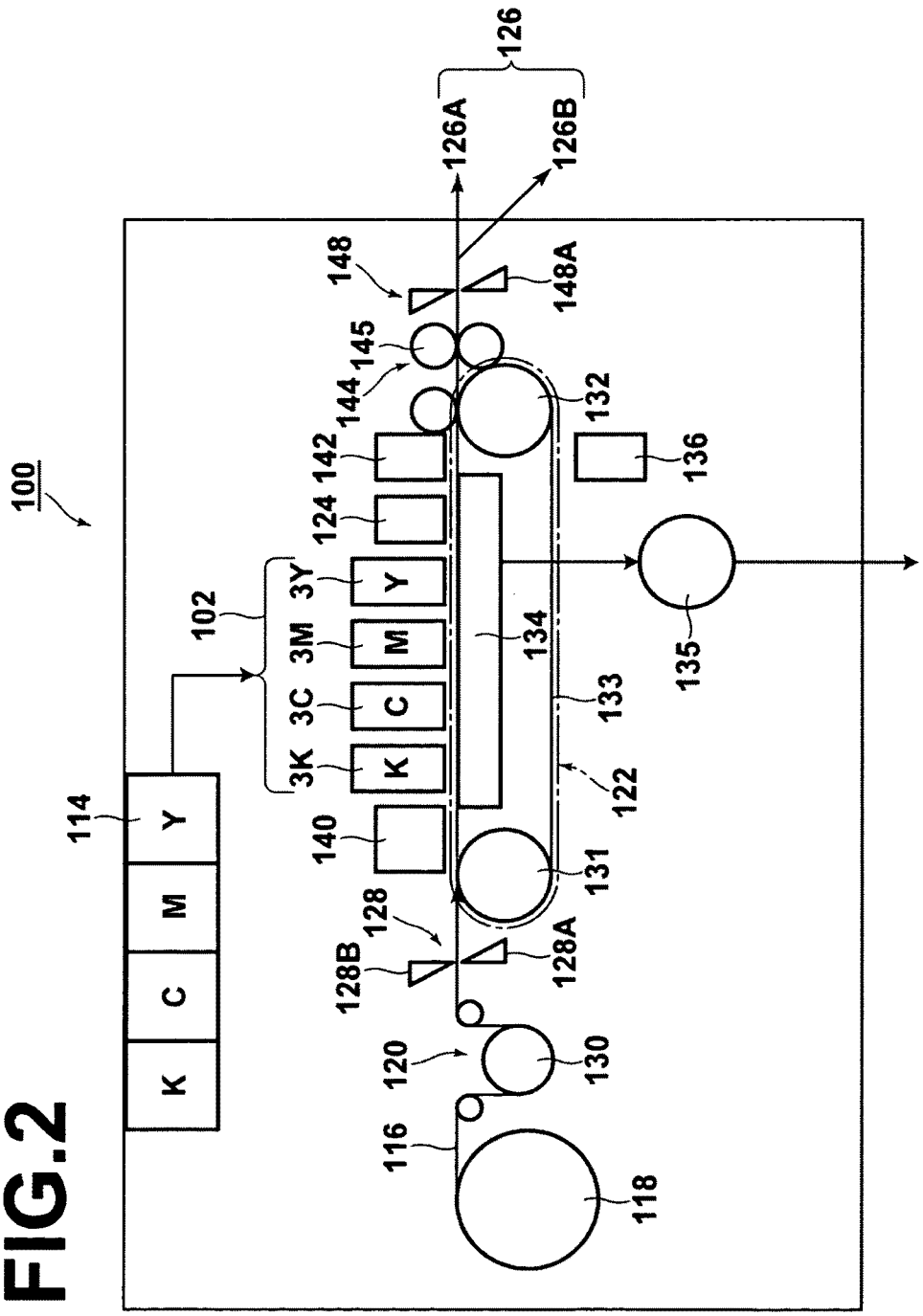
FIG. 2 is a diagram illustrating a configuration example of an inkjet recording device including the inkjet recording head shown in FIG. 1.
Figure 3:
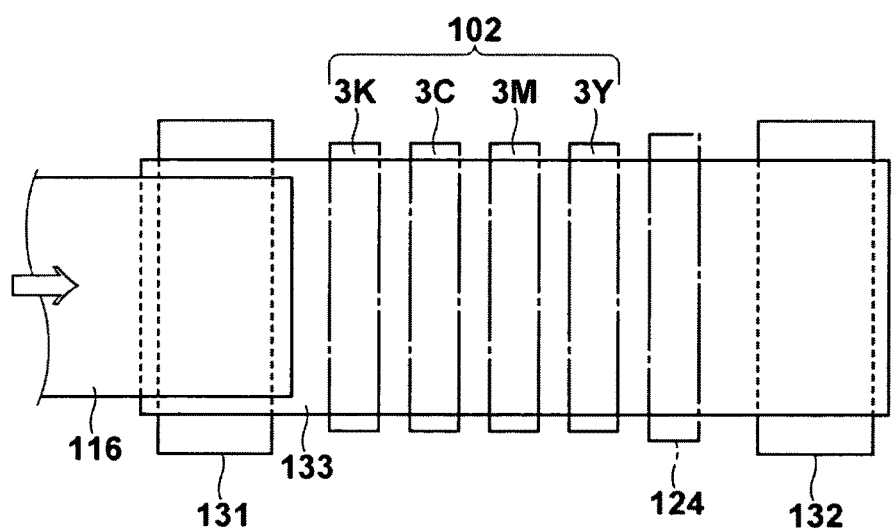
FIG. 3 is a partial plan view of the inkjet recording device shown in FIG. 2.

Now, an example configuration of an inkjet recording device including the inkjet recording head 3 of the above-described embodiment is described with reference to FIGS. 2 and 3. FIG. 2 shows the entire device configuration, and FIG. 3 is a partial plan view of the device.

An inkjet recording device 100 shown in the drawing generally includes: a printing section 102 having a plurality of inkjet recording heads (hereinafter simply referred to as "heads") 3K, 3C, 3M and 3Y provided correspondingly to ink colors; an ink storing and charging section 114 for storing inks to be fed to the heads 3K, 3C, 3M and 3Y; a paper feeding section 118 for feeding recording paper 116; a decurling section 120 for decurling the recording paper 116; a suction belt conveyer section 122 disposed to face to a nozzle surface (ink discharge surface) of the printing section 102, for conveying the recording paper 116 with keeping the flatness of the recording paper 116; a print detection section 124 for reading the result of printing at the printing section 102; and a paper discharge section 126 for discharging the printed recording paper (a print) to the outside.

Each of the heads 3K, 3C, 3M and 3Y forming the printing section 102 is the inkjet recording head 3 of the above-described embodiment.

At the decurling section 120, the recording paper 116 is decurled with a heating drum 130 heating the recording paper 116 in a direction opposite to the direction of the curl.

In the device using the roll paper, a cutter 128 is provided downstream the decurling section 120, as shown in FIG. 2, so that the roll paper is cut by the cutter into a sheet of a desired size. The cutter 128 is formed by a fixed blade 128A, which has a length equal to or larger than the width of the conveyance path for the recording paper 116, and a round blade 128B, which moves along the fixed blade 128A. The fixed blade 128A is disposed on the back surface side of the print, and the round blade 128B is disposed on the print surface side via the conveyance path. In a case where the device uses cut sheets, the cutter 128 is not necessary.

The decurled and cut recording paper sheet 116 is sent to the suction belt conveyer section 122. The suction belt conveyer section 122 includes an endless belt 133 wrapped around rollers 131 and 132, and is adapted such that at least an area of the belt facing the nozzle surface of the printing section 102 and a sensor surface of the print detection section 124 forms a horizontal (flat) surface.

The belt 133 has a width that is larger than the width of the recording paper sheet 116, and a number of suction holes (not shown) are formed in the belt surface. A suction chamber 134 is provided on the inner side of the belt 133 wrapped around the rollers 131 and 132 at a position where the suction chamber 134 faces to the nozzle surface of the printing section 102 and the sensor surface of the print detection section 124. A suction force generated by a fan 135 provides the suction chamber 134 with a negative pressure, thereby suctioning and holding the recording paper sheet 116 on the belt 133.

As a motive force from a motor (not shown) is transmitted to at least one of the rollers 131 and 132, around which the belt 133 is wrapped, the belt 133 is driven in the clockwise direction in FIG. 2, and the recording paper sheet 116 held on the belt 133 is conveyed from the left to the right in FIG. 2.

In a case where margin-less printing, or the like, is carried out, the inks adhere on the belt 133. Therefore, a belt cleaning section 136 is provided at a predetermined position (any appropriate position other than the print region) on the outer side of the belt 133.

A heating fan 140 is provided upstream the printing section 102 along the paper sheet conveyance path formed by the suction belt conveyer section 122. The heating fan 140 blows heating air onto the recording paper sheet 116 to heat the recording paper sheet 116 before printing. Heating the recording paper sheet 116 immediately before printing promotes drying of the deposited ink.

The printing section 102 is a so-called full-line head, in which line heads, each having a length corresponding to the maximum paper width, are arranged in a direction (main scanning direction) perpendicular to the paper feed direction (see FIG. 3). Each recording head 3K, 3C, 3M, 3Y is formed by a line head, which has a plurality of ink discharge orifices (nozzles) provided across a length that is larger than at least one side of the recording paper sheet 116 of the maximum size printable by the inkjet recording device 100.

The heads 3K, 3C, 3M and 3Y respectively corresponding to the color inks of black (K), cyan (C), magenta (M) and yellow (Y) are disposed in this order from the upstream along the feed direction of the recording paper sheet 116. By discharging the color inks from the heads 3K, 3C, 3M and 3Y while the recording paper sheet 116 is conveyed, a color image is recorded on the recording paper sheet 116.

The print detection section 124 is formed by a line sensor, or the like, which images the result of ink droplets deposited by the printing section 102, and the image of the deposited ink droplets read by the line sensor is used to detect discharge defects, such as clogging of the nozzles.

A drying section 142 formed, for example, by a heating fan for drying the printed image surface is disposed downstream the print detection section 124. Since contact with the printed surface should be avoided until the printed inks dry, blowing hot air may be preferred.

A heating and pressurizing section 144 for controlling the gloss of the image surface is disposed downstream the drying section 142. The heating and pressurizing section 144 presses the image surface with a pressure roller 145 having a predetermined textured pattern on the surface thereof while heating the image surface, thereby transferring the textured pattern onto the image surface.

The thus obtained print is discharged at the paper discharge section 126. Prints of intended images (prints on which intended images are printed) and test prints may separately be discharged. The inkjet recording device 100 includes a sorting means (not shown) for sorting the prints of intended images and the test prints and switching the discharge paths to selectively send them to a discharge section 126A or 126B.

In a case where an intended image and a test print are printed at the same time on a large-sized paper sheet, a cutter 148 may be provided to cut off the test print area.

The configuration of the inkjet recording device 100 is as described above.

Modification

The present invention is not limited to the above-described embodiments, and may be modified as appropriate without departing from the spirit and scope of the invention.

EXAMPLES

Now, examples according to the invention and comparative examples are described.

Example 1

A 30 nm-thick Ti film and a 150 nm-thick Ir film, which serve as a lower electrode, were formed in this order on a SOI substrate through sputtering at a substrate temperature of 350° C. A 4 μm-thick Nb-doped PZT piezoelectric film was formed on the lower electrode. Film formation conditions were as follows:

film formation device: a RF sputtering apparatus, target: $Pb_{1.3}((Zr_{0.52}Ti_{0.48})_{0.88}Nb_{0.12})O_3$ sintered body (the amount of Nb at the B-site: 12 mol %), substrate temperature: 450° C., substrate-target distance: 60 mm, pressure during film formation: 0.29 Pa, film formation gas: $Ar/O_2$=97.5/2.5 (molar ratio).

Figure 4:
FIG. 4 shows a TEM cross section image of a piezoelectric film of Example 1.

A cross section of the piezoelectric film after-completion of film formation was observed with a TEM, and the film was found to have a columnar structure. FIG. 4 shows the TEM cross section image.

Figure 5:
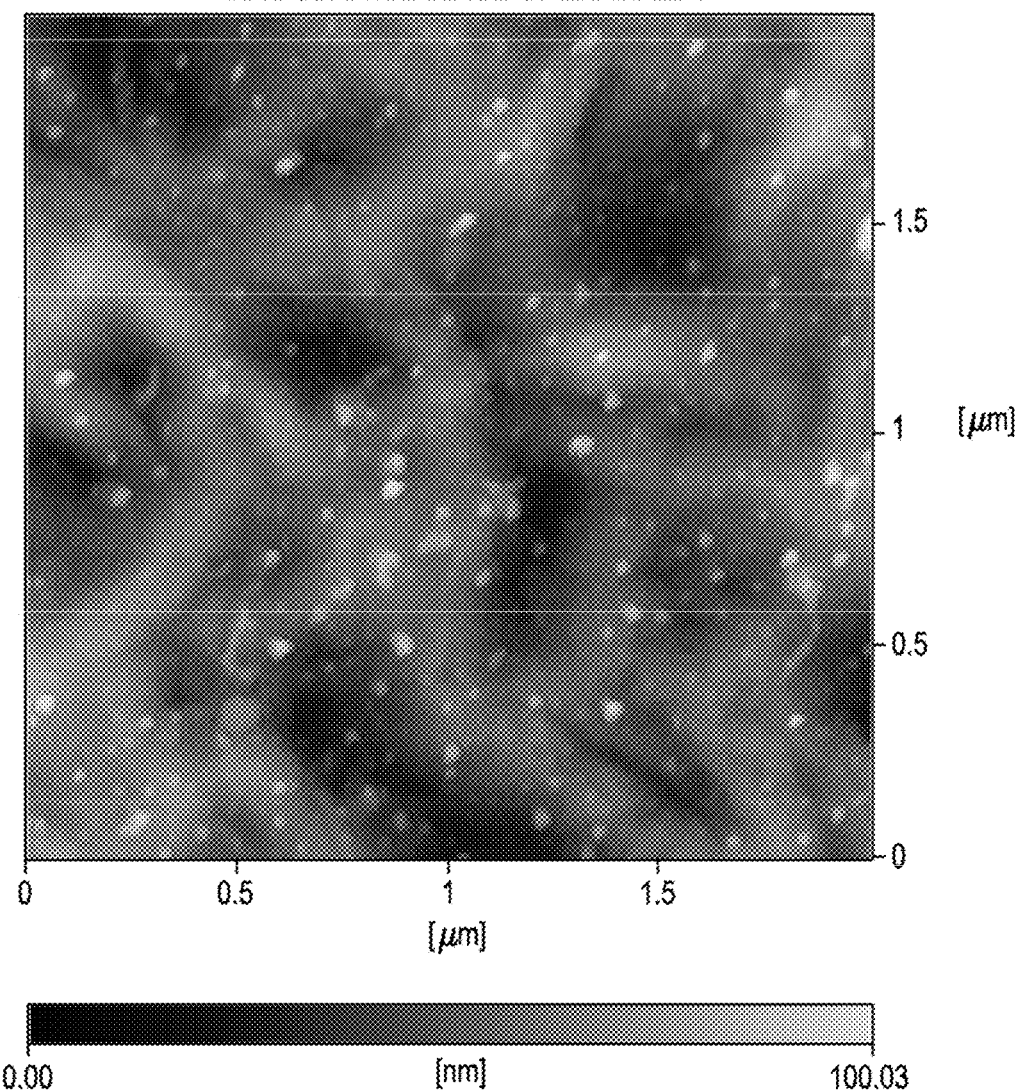
FIG. 5 shows an AFM surface image of the piezoelectric film of Example 1.

The surface of the piezoelectric film after completion of film formation was observed with an AFM. FIG. 5 shows the AFM surface image. No large grain, as those observed in comparative examples, which will be described later, was observed, and the film had a dense structure. The surface morphology of the piezoelectric film was measured with an AFM, and the surface roughness value P-V was found to be 50.15 nm and the surface roughness value Ra was found to be 7.08 nm.

Subsequently, a Pt/Ti upper electrode (Pt: 150 nm-thick/Ti: 30 nm-thick) was formed through vapor deposition on the piezoelectric film (Ti serves as an adhesion layer and Pt mainly serves as the electrode) and was patterned into a circle having a diameter of 400 μm to provide a piezoelectric device.

A DC voltage was applied across the lower electrode and the upper electrode and a withstand voltage was measured with a breakdown voltage being a point where the current value was 1 μA or more. The withstand voltage of the resulting piezoelectric film was 200 V.

Finally, an open pool structure was formed by machining the back side of the substrate to provide an inkjet recording head. The piezoelectric constant $d_{31}$ was measured and found to be $d_{31}$=250 pC/N.

The inkjet recording head was driven under conditions of 100 kHz and 25 V in an atmosphere of the temperature of 40° C. and the relative humidity of 80%. Even after the head had been driven for $1\times10^{11}$ dots, the piezoelectric film had no breakdown and no deterioration of displacement property and thus had good durability.

The film formation conditions and results of the evaluation were shown in Tables 1 and 2 below.

Examples 2 to 8

Piezoelectric devices and inkjet recording heads were provided in the same manner as in Example 1, except that the film formation conditions for forming the piezoelectric film were changed to those shown in Tables 1 and 2 below.

In Examples 5 to 7, the composition of the target was changed to $Pb_{1.05}((Zr_{0.52}Ti_{0.48})_{0.88}Nb_{0.12})O_3$.

In Example 8, the same target as that used in Example 1 was used, and a Bi chip was placed on the target to form a PZT film doped with Bi and Nb. The amount of Bi in the A-site was 4 mol %.

In all the examples, the TEM cross section images and the AFM surface images were similar to those in Example 1. Results of other evaluation items are shown in Table 2 below.

All the films had a surface roughness value P-V of not more than 170.0 nm, a surface roughness value Ra of not more than 16.0 nm, a piezoelectric constant $d_{31}$ of 200 pC/N or more, and a withstand voltage of 80 V or more. The film of Example 4 having the withstand voltage of 80.7 V was driven in the same manner as in Example 1 under the conditions of 100 kHz and 25 V in an atmosphere of the temperature of 40° C. and the relative humidity of 80%. Even after the head had been driven for $5.0\times10^{10}$ dots, the piezoelectric film had no breakdown and no deterioration of displacement property and thus had good durability. It was found that the films of Examples 1 to 8 having a withstand voltage of 80 V or more were superior in drive durability at least by two orders of magnitude to a film of Comparative Example 1 having a withstand voltage of 61 V, which will be described later. For application as an inkjet recording head, the durability with a withstand voltage of 80 V or more may be preferred.

Comparative Example 1

A piezoelectric device and an inkjet recording head were provided in the same manner as in Example 1, except that the film formation conditions for forming the piezoelectric film were changed to those shown in Tables 1 and 2 below, and the composition of the film formation gas was changed to $Ar/O_2$=99.0/1.0 (molar ratio).

A cross section of the piezoelectric film after completion of film formation was observed with a TEM, and the film was found to have a columnar structure which was similar to that of the film of Example 1.

Figure 6:
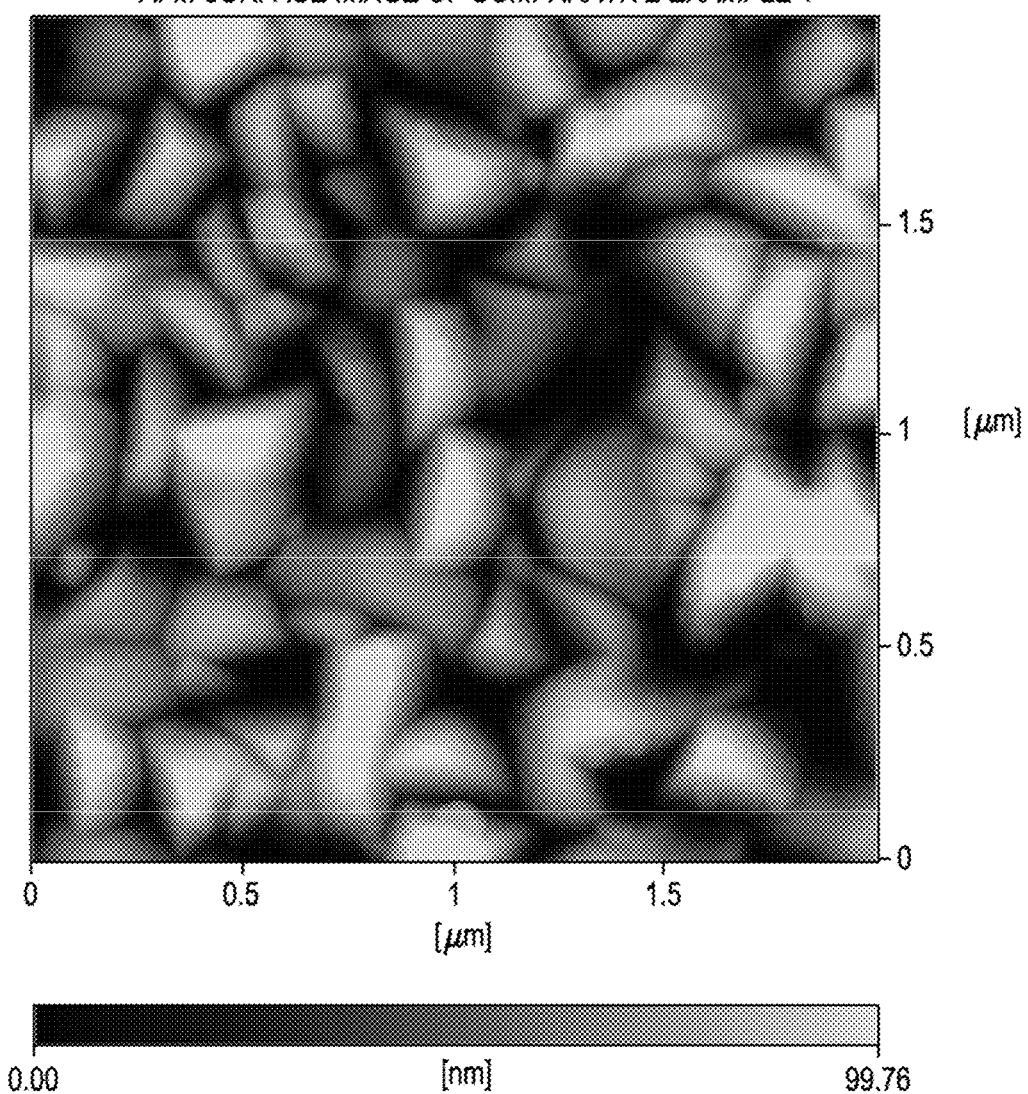
FIG. 6 shows an AFM surface image of a piezoelectric film of Comparative Example 1.

The surface of the piezoelectric film after completion of film formation was observed with an AFM. FIG. 6 shows the AFM surface image. Unlike the film of Example 1, many large grains were observed, and the film had a structure with a high amount of pores between grains.

The surface morphology of the piezoelectric film was measured with an AFM, and the surface roughness value P-V was found to be 198.6 nm and the surface roughness value Ra was found to be 25.5 nm.

A DC voltage was applied across the lower electrode and the upper electrode and a withstand voltage was measured with a breakdown voltage being a point where the current value was 1 μA or more. The withstand voltage of the resulting piezoelectric film was 61 V.

The piezoelectric constant $d_{31}$ was measured and found to be $d_{31}$=190 pC/N. The inkjet recording head was driven under conditions of 100 kHz and 25 V. After the head had been driven for 1×10⁸ dots, breakdown occurred and the piezoelectric film was no longer displaced. Results of the evaluation are shown in Tables 1 and 2 below.

Comparative Example 2 to 4

Piezoelectric devices and inkjet recording heads were provided in the same manner as in Comparative Example 1, except that the film formation conditions for forming the piezoelectric film were changed to those shown in Tables 1 and 2 below.

In all the comparative examples, the TEM cross section images and the AFM surface images were similar to those in Comparative Example 1. Results of other evaluation items are shown in Table 2 below.

Conclusion on Results of Examples 1 to 8 and Comparative Examples 1 to 4

Figure 7A:
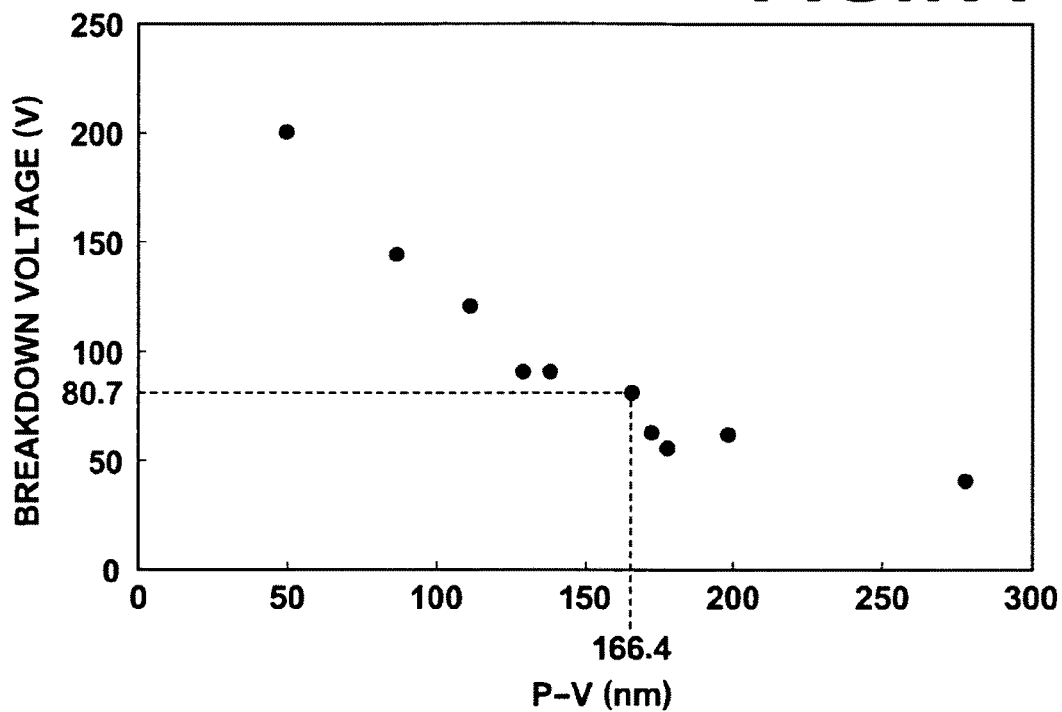
FIG. 7A shows a relationship between a surface roughness value P-V and a withstand voltage of piezoelectric films obtained in Examples 1 to 8 and Comparative Examples 1 to 4.
Figure 7B:
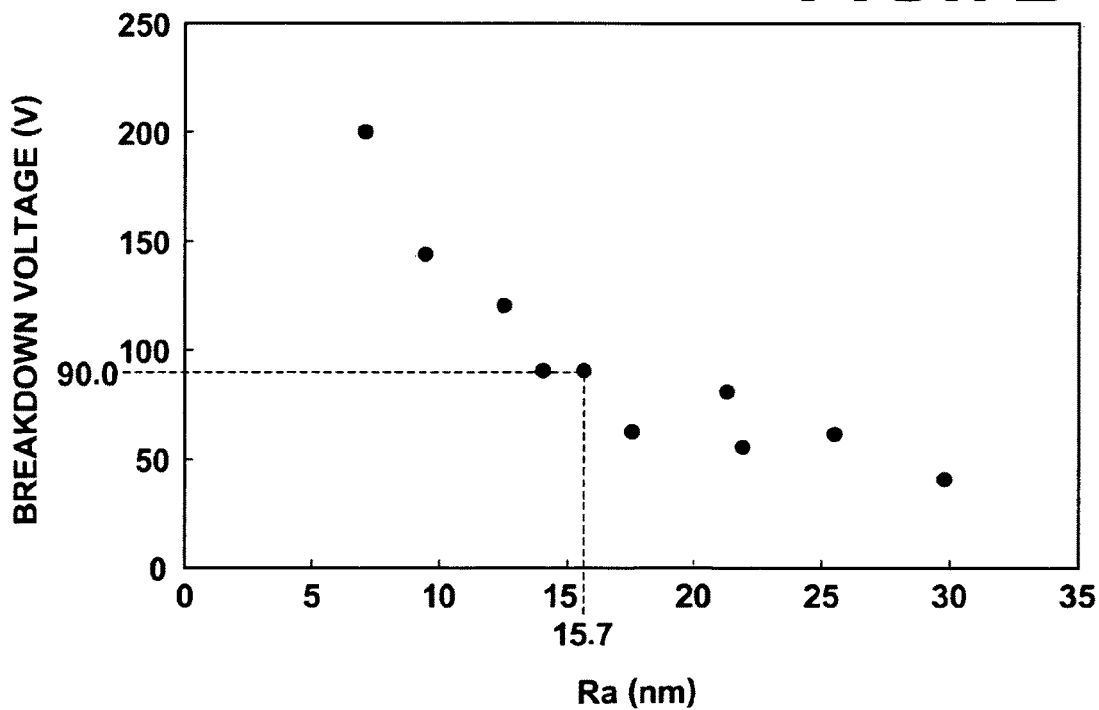
FIG. 7B shows a relationship between a surface roughness value Ra and a withstand voltage of the piezoelectric films obtained in Examples 1 to 8 and Comparative Examples 1 to 4.

The relationship between the surface roughness value P-V and the withstand voltage, and the relationship between the surface roughness value Ra and the withstand voltage for the films obtained in Examples 1 to 8 and Comparative Examples 1 to 4 are shown in FIGS. 7A and 7B.

As shown in FIGS. 7A and 7B, there is a correlation between the surface roughness value P-V and the withstand voltage, and there is a correlation between the surface roughness value Ra and the withstand voltage. When the surface roughness value P-V was not more than 170.0 nm, or when the surface roughness value Ra was not more than 16.0 nm, the withstand voltage of 80 V or more was achieved.

In other words, it has become clear that a film having a withstand voltage of 80 V or more can stably be provided by forming the film which satisfies the above-described surface roughness value P-V or surface roughness value Ra at the time of completion of film formation. It should be noted that the final surface roughness of the film is the same as the surface roughness at the time of completion of film formation as long as no surface treatment to change the surface roughness is carried out after the film is formed.

In particular, since data of the relationship between the surface roughness value P-V and the withstand voltage has smaller variation than data of the relationship between the surface roughness value Ra and the withstand voltage, it may be more preferable to control the film formation conditions based on the surface roughness value P-V.

For the films obtained in Examples 1 to 8 and Comparative Examples 1 to 4 and for films formed under the same film formation conditions and having different film thicknesses, the relationships between the film thickness and a withstand electric field (kV/cm) calculated from the withstand voltage are plotted, as shown in FIG. 8.

A breakdown mode when a voltage is applied can be approximated with a weakest link model represented by the equation below:

$$E = E_0 \{-\ln(1-P_x)\}^{\frac{1}{m}} d^{-\frac{1}{m}}$$

(wherein E is a breakdown voltage that causes breakdown with a probability $P_x$, m is a shape parameter and d is a film thickness (to be precise, a multiple of a unit film thickness, which is 1 μm (dimensionless number)).

The present inventors set $P_x=0.9$ and varied the values of m and $E_0$ in the above equation of the weakest link model to find the values of m and $E_0$ which bring the plots onto fitting curves.

For the resulting films, the plots were successfully brought onto the fitting curves by approximating the results with setting the shape parameter m=1. The fitting curves and the values of $E_0$ are shown in FIG. 8. The values of $E_0$ are shown in Table 2.

Figure 9:
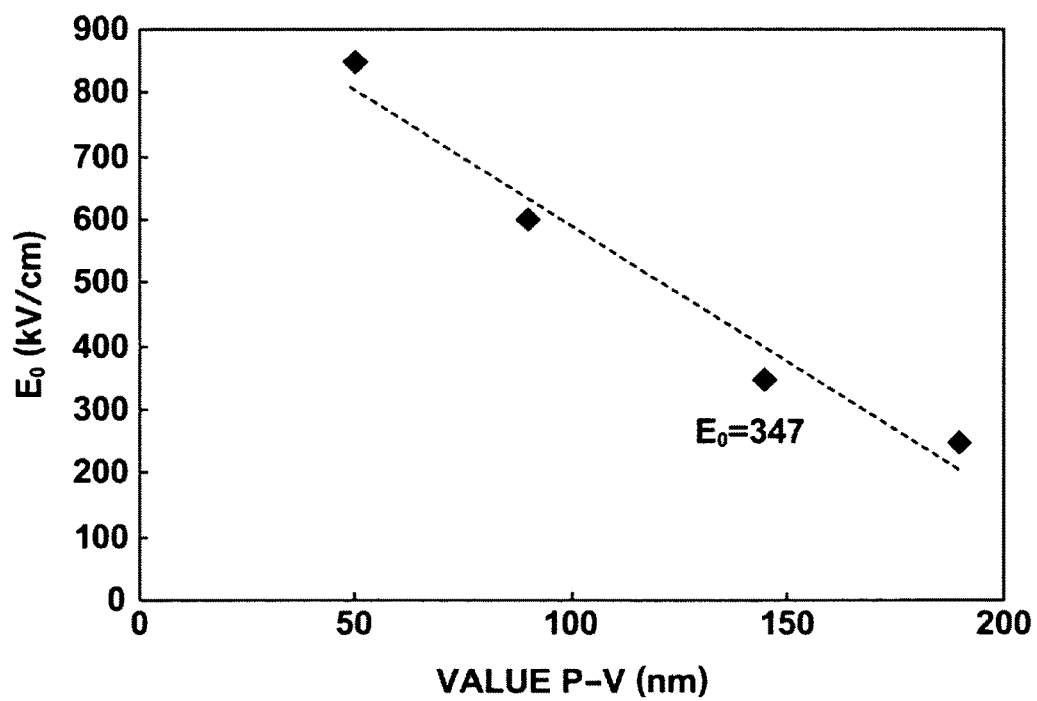
FIG. 9 shows a relationship between a surface roughness value P-V and $E_0$ for the piezoelectric films obtained in Examples 1 to 8 and Comparative Examples 1 to 4.

The relationship between the surface roughness value P-V and $E_0$ is shown in FIG. 9.

As can be seen from FIGS. 8 and 9, the value of $E_0$ differs depending on the surface roughness value P-V. That is, it has been found that the withstand voltage of the sputtered film is influenced by the surface roughness value P-V, which represents the surface condition of the film, in addition to the factors included in a general weakest link model.

Further, it has became clear that the surface roughness value P-V of not more than 170.0 nm is achieved, and thus the withstand voltage of 80 V or more is achieved, when the value of $E_0$ is greater than 250 kV/cm, or optionally the value of $E_0$ is 347 kV or more. That is, a film having the withstand voltage of 80 V or more can stably be provided by forming the film under conditions where the value of $E_0$ is greater than 250 kV/cm, or optionally the value of $E_0$ is 347 kV or more.

Rewriting the above equation with respect to the breakdown voltage and incorporating the P-V value h, the equation below is obtained:

$$V = dE = E_0 \times -\ln(1-P_x) \infty -h \ 0 < P_x < 1 \ E_0 \infty -h$$

As can be seen from this equation, V is in inverse proportion to the P-V value h. This corresponds to the results shown in FIG. 7A.

TABLE 1

| | Amount of Pb in Target (Pb/(B-site ion)) | Amount of Donor Ion (mol % in A- or B-site) | Pressure During Film Formation (Pa) | Substrate Temperature (° C.) | Substrate-Target Distance (mm) |
|---|---|---|---|---|---|
| Ex. 1 | 1.30 | Nb 12% | 0.29 | 450 | 60 |
| Ex. 2 | 1.30 | Nb 12% | 0.33 | 550 | 80 |
| Ex. 3 | 1.30 | Nb 12% | 1.00 | 550 | 80 |
| Ex. 4 | 1.30 | Nb 12% | 1.10 | 550 | 80 |
| Ex. 5 | 1.05 | Nb 12% | 1.00 | 530 | 80 |
| Ex. 6 | 1.05 | Nb 12% | 0.64 | 530 | 80 |
| Ex. 7 | 1.05 | Nb 12% | 0.33 | 530 | 80 |
| Ex. 8 | 1.30 | Bi 4%, Nb 12% | 0.64 | 520 | 60 |
| Comp. Ex. 1 | 1.30 | Nb 12% | 1.30 | 550 | 80 |
| Comp. Ex. 2 | 1.30 | Nb 12% | 1.40 | 550 | 50 |

TABLE 1-continued

| | Amount of Pb in Target (Pb/(B-site ion)) | Amount of Donor Ion (mol % in A- or B-site) | Pressure During Film Formation (Pa) | Substrate Temperature (° C.) | Substrate-Target Distance (mm) |
|---|---|---|---|---|---|
| Comp. Ex. 3 | 1.05 | Nb 12% | 1.10 | 530 | 60 |
| Comp. Ex. 4 | 1.05 | Nb 12% | 1.10 | 530 | 60 |

TABLE 2

| | Film Thickness ($\mu$m) | P—V (nm) | Ra (nm) | $d_{31}$ (pC/V) | Withstand Voltage (V) | Drive Durability (dot) | $E_0$ (kV/cm) |
|---|---|---|---|---|---|---|---|
| Ex. 1 | 4.0 | 50.15 | 7.08 | 250 | 200.0 | $>1 \times 10^{11}$ | 850 |
| Ex. 2 | 3.0 | 87.01 | 9.46 | 220 | 144.0 | | 600 |
| Ex. 3 | 4.0 | 129.5 | 15.7 | 240 | 90.0 | | 347 |
| Ex. 4 | 4.0 | 166.4 | 21.3 | 240 | 80.7 | $>5 \times 10^{10}$ | 347 |
| Ex. 5 | 4.0 | 138.6 | 14.0 | 240 | 90.0 | | 347 |
| Ex. 6 | 2.5 | 111.2 | 12.6 | 230 | 120.0 | | |
| Ex. 7 | 2.0 | 50.0 | | 200 | 200.0 | | 850 |
| Ex. 8 | 4.0 | 105.0 | | 200 | 120.0 | | |
| Comp. Ex. 1 | 4.0 | 198.6 | 25.5 | 190 | 61.0 | $1 \times 10^8$ | 250 |
| Comp. Ex. 2 | 4.0 | 278.0 | 29.8 | 240 | 40.0 | | |
| Comp. Ex. 3 | 2.5 | 178.0 | 21.9 | 210 | 55.0 | | 250 |
| Comp. Ex. 4 | 2.0 | 173.0 | 17.6 | 200 | 62.0 | | 250 |

Example 9

A 30 nm-thick Ti film and a 150 nm-thick Ir film, which serve as a lower electrode, were formed in this order on a SOI substrate through sputtering at a substrate temperature of 350° C. Then, a piezoelectric film was formed on the lower electrode through a sol-gel method.

Specifically, a $Pb_{1.05}(Zr_{0.46}Ti_{0.42}Nb_{0.12})O_x$ coating solution (concentration was 0.5 mol/l) was coated on the lower electrode through spin coating at 500 rpm for 5 seconds and then at 2000 rpm for 15 seconds to achieve a substantially uniform film thickness. The coated film was dried at 250° C. for 5 minutes. Then, the dried film was degreased in the ambient atmosphere at 400° C. for 10 minutes. The above-described coating, drying and degreasing steps were repeated five times in total to form five piezoelectric material layers. After the five layers were formed one on the other, they were heated at 800° C. for 10 minutes through RTA to promote crystallization of the piezoelectric material to improve properties of the piezoelectric material. The resulted thin film was analyzed through XRD, and it was confirmed that a perovskite crystal structure was provided. The total film thickness of the five-layered piezoelectric film was 1.2 $\mu$m. The surface morphology of the piezoelectric film was measured with an AFM, and the surface roughness value P-V was found to be 120.5 nm.

Subsequently, a Pt/Ti upper electrode (Pt: 150 nm-thick/Ti: 30 nm-thick) was formed through vapor deposition on the piezoelectric film (Ti serves as an adhesion layer and Pt mainly serves as the electrode) and was patterned into a circle having a diameter of 400 $\mu$m to provide a piezoelectric device.

A DC voltage was applied across the lower electrode and the upper electrode and a withstand voltage was measured with a breakdown voltage being a point where the current value was 1 $\mu$A or more. The withstand voltage of the resulting piezoelectric film was 100 V.

Finally, an open pool structure was formed by machining the back side of the substrate to provide an inkjet recording head. The piezoelectric constant $d_{31}$ was measured and found to be $d_{31}$=165 pC/N.

Comparative Example 5

A 30 nm-thick Ti film and a 150 nm-thick Ir film, which serve as a lower electrode, were formed in this order on a SOI substrate through sputtering at a substrate temperature of 350° C. Then, a piezoelectric film was formed on the lower electrode through a sol-gel method.

Specifically, a $Pb_{1.05}(Zr_{0.46}Ti_{0.42}Nb_{0.06})O_x$ coating solution (concentration was 0.7 mol/l) was coated on the lower electrode through spin coating at 500 rpm for 5 seconds and then at 2000 rpm for 15 seconds to achieve a substantially uniform film thickness. The coated film was dried at 250° C. for 5 minutes. Then, the dried film was degreased in the ambient atmosphere at 400° C. for 10 minutes. The above-described coating, drying and degreasing steps were repeated five times in total to form five piezoelectric material layers. After the five layers were formed one on the other, they were heated at 700° C. for 10 minutes through RTA to promote crystallization of the piezoelectric material to improve properties of the piezoelectric material. The resulted thin film was analyzed through XRD, and it was confirmed that a perovskite crystal structure was provided. The total film thickness of the five-layered piezoelectric film was 1.0 $\mu$m. The surface morphology of the piezoelectric film was measured with an AFM, and the surface roughness value P-V was found to be 220 nm.

Subsequently, a Pt/Ti upper electrode (Pt: 150 nm-thick/Ti: 30 nm-thick) was formed through vapor deposition on the piezoelectric film (Ti serves as an adhesion layer and Pt mainly serves as the electrode) and was patterned into a circle having a diameter of 400 μm to provide a piezoelectric device.

A DC voltage was applied across the lower electrode and the upper electrode and a withstand voltage was measured with a breakdown voltage being a point where the current value was 1 μA or more. The withstand voltage of the resulting piezoelectric film was 40 V. Finally, an open pool structure was formed by machining the back side of the substrate to provide an inkjet recording head. The piezoelectric constant $d_{31}$ was measured and found to be $d_{31}=120$ pC/N.

INDUSTRIAL APPLICABILITY

The piezoelectric film of the invention is preferably applicable to piezoelectric actuators provided in inkjet recording heads, magnetic read/write heads, MEMS (Micro Electro-Mechanical Systems) devices, micropumps, ultrasound probes, ultrasound motors, etc., and ferroelectric devices, such as ferroelectric memory.

What is claimed is:

1. A piezoelectric film comprising a columnar structure comprising numerous columnar bodies extending in a direction not parallel to a film surface, said piezoelectric film having a surface roughness value P-V of not more than 170.0 nm, the surface roughness value P-V being defined by a difference between a maximum height (peak value P) and a minimum height (valley value V) on a film surface, a piezoelectric constant $d_{31}$ greater than 150 pC/N and a breakdown voltage of 80 V or more, the breakdown voltage being defined by an applied voltage that results in a current value of 1 μA or more.

2. The piezoelectric film as claimed in claim 1, wherein the piezoelectric constant $d_{31}$ is 200 pC/N or more.

3. The piezoelectric film as claimed in claim 1, wherein the breakdown voltage is within a range from 80 to 200 V.

4. The piezoelectric film as claimed in claim 1, which is not subjected to a surface treatment to reduce a surface roughness after the film is formed.

5. The piezoelectric film as claimed in claim 1, which is not provided with an orientation controlling layer as an underlayer.

6. The piezoelectric film as claimed in claim 1 having a film thickness of 1.0 μm or more.

7. The piezoelectric film as claimed in claim 6, wherein the film thickness is in a range from 2.0 to 4.0 μm.

8. The piezoelectric film as claimed in claim 1 comprising one or two or more perovskite oxides (P), which may contain inevitable impurities represented by the formula below:

$$ABO_3 \hspace{5em} \text{General Formula (P)}$$

wherein A represents an A-site element and is at least one element including Pb; B represents a B-site element and is at least one element selected from the group consisting of Ti, Zr, V, Nb, Ta, Cr, Mo, W, Mn, Sc, Co, Cu, In, Sn, Ga, Zn, Cd, Fe and Ni; O is an oxygen element; and a molar ratio of A-site element:B-site element:oxygen element is 1:1:3 as a standard; however, the molar ratio may be varied from the standard molar ratio within a range where a perovskite structure is obtained.

9. The piezoelectric film as claimed in claim 8 comprising one or two or more perovskite oxides (PX) which may contain inevitable impurities, represented by the formula below:

$$A(Zr_x,Ti_y,M_z)O \hspace{5em} (PX)$$

wherein A represents an A-site element and is at least one element including Pb; M represents one or two or more metal elements; $0<x$, $0<y$, $0<z$; and a molar ratio of A-site element (A):B-site element (Zr,Ti,M):oxygen element is 1:1:3 as a standard; however, the molar ratio may be varied from the standard molar ratio within a range where a perovskite structure is obtained.

10. The piezoelectric film as claimed in claim 9, wherein M of the perovskite oxide (PX) is at least one element selected from the group consisting of V, Nb, Ta and Sb.

11. A method for forming a piezoelectric film, the method comprising
forming the film under conditions where a surface roughness value P-V is not more than 170.0 nm, the surface roughness value P-V being defined by a difference between a maximum height (peak value P) and a minimum height (valley value V) on a film surface.

12. The method for forming a piezoelectric film as claimed in claim 11, wherein the film is formed under conditions where a pressure during film formation through a vapor deposition process using plasma is not more than 1.1 Pa and a substrate-target distance is not less than 80 mm.

13. The method for forming a piezoelectric film as claimed in claim 11, wherein the film is formed under conditions where a pressure during film formation through a vapor deposition process using plasma is not more than 1.0 Pa and a substrate-target distance is not less than 60 mm.

14. The method for forming a piezoelectric film as claimed in claim 11, wherein the vapor deposition process comprises sputtering.

15. The method for forming a piezoelectric film as claimed in claim 11, wherein the piezoelectric film comprises one or two or more perovskite oxides (P), which may contain inevitable impurities, represented by the formula below:

$$ABO_3 \hspace{5em} \text{General Formula (P)}$$

wherein A represents an A-site element and is at least one element including Pb; B represents a B-site element and is at least one element selected from the group consisting of Ti, Zr, V, Nb, Ta, Cr, Mo, W, Mn, Sc, Co, Cu, In, Sn, Ga, Zn, Cd, Fe and Ni; O is an oxygen element; a molar ratio of A-site element:B-site element:oxygen element is 1:1:3 as a standard; however, the molar ratio may be varied from the standard molar ratio within a range where a perovskite structure is obtained.

16. The method for forming a piezoelectric film as claimed in claim 15, wherein the piezoelectric film comprises one or two or more perovskite oxides (PX), which may contain inevitable impurities, represented by the formula below:

$$A(Zr_x,Ti_y,M_z)O \hspace{5em} (PX)$$

wherein A represents an A-site element and is at least one element including Pb; M represents one or two or more metal elements; $0<x$, $0<y$, $0<z$; and a molar ratio of A-site element (A):B-site element (Zr,Ti,M):oxygen element is 1:1:3 as a standard; however, the molar ratio may be varied from the standard molar ratio within a range where a perovskite structure is obtained.

17. The method for forming a piezoelectric film as claimed in claim 16, wherein M of the perovskite oxide (PX) is at least one element selected from the group consisting of V, Nb, Ta and Sb.

18. A piezoelectric device comprising:
the piezoelectric film as claimed in claim 1; and
an electrode for applying an electric field to the piezoelectric film.

19. A liquid discharge device comprising:
the piezoelectric device as claimed in claim 18; and a liquid discharge member disposed adjacent to the piezoelectric device, the liquid discharge member comprising a liquid reservoir for storing a liquid, and a liquid discharge port for discharging the liquid from the liquid reservoir to the outside in response to application of the electric field to the piezoelectric film.

20. The piezoelectric film as claimed in claim 10, wherein A of the A-site element is Pb and M of the B-site element is Nb.

\* \* \* \* \*